United States Patent
Jung et al.

(10) Patent No.: US 7,859,920 B2
(45) Date of Patent: Dec. 28, 2010

(54) ADVANCED BIT LINE TRACKING IN HIGH PERFORMANCE MEMORY COMPILERS

(75) Inventors: Chang Ho Jung, San Diego, CA (US); Nan Chen, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 197 days.

(21) Appl. No.: 12/048,676

(22) Filed: Mar. 14, 2008

(65) Prior Publication Data

US 2009/0231934 A1 Sep. 17, 2009

(51) Int. Cl.
*G11C 7/00* (2006.01)
*G11C 8/00* (2006.01)

(52) U.S. Cl. .................. 365/189.15; 365/194; 365/203; 365/210; 365/210.1

(58) Field of Classification Search ........................ None
See application file for complete search history.

(56) References Cited

U.S. PATENT DOCUMENTS

| | | | |
|---|---|---|---|
| 5,596,539 A | 1/1997 | Passow et al. | |
| 5,724,294 A | 3/1998 | Khieu | |
| 6,229,746 B1 | 5/2001 | Tooher | |
| 6,996,020 B2 * | 2/2006 | Yoshida | 365/210.1 |
| 7,016,245 B2 | 3/2006 | Balasubramanian et al. | |
| 7,142,466 B1 | 11/2006 | Muthalif et al. | |
| 2004/0223398 A1 | 11/2004 | Brown et al. | |
| 2008/0298143 A1 * | 12/2008 | Chen et al. | 365/194 |

OTHER PUBLICATIONS

International Search Report-PCT/US09/035369, International Search Authority-European Patent Office-May 20, 2009.
Written Opinion-PCT/US09/035369, International Search Authority-European Patent Office-May 20, 2009.

* cited by examiner

*Primary Examiner*—Hoai V Ho
*Assistant Examiner*—James G Norman
(74) *Attorney, Agent, or Firm*—Peter M. Kamarchik; Nicholas J. Pauley; Jonathan T. Velasco

(57) ABSTRACT

A method accurately tracks a bit line maturing time for compiler memory. The method includes enabling a dummy word line in response to an internal clock signal. The dummy word line is enabled prior to enabling a real word line. A dummy bit line is matured in response to enabling of the dummy word line. The dummy bit line matures at a same rate that a real bit line matures. The method also includes disabling the dummy word line in response to determining a threshold voltage differential based on monitoring maturation of the dummy bit line. The real word line is enabled a predefined delay after enabling of the dummy word line. Similarly, the word line is disabled the predefined delay after disabling of the dummy word line. In response to disabling the dummy word line, a sense enable signal is generated.

15 Claims, 5 Drawing Sheets

ADVANCED BIT LINE TRACKING IN HIGH PERFORMANCE MEMORY COMPILERS

TECHNICAL FIELD

The present disclosure relates to memory circuits. More specifically, the present disclosure relates to timing control in compiler memory.

BACKGROUND

Generally speaking, in a memory read operation, at the active clock edge, internal clock signals are generated, a self time track is activated, a bit line pre-charge signal is disabled, and input addresses are latched. Once decoded, a word line is turned on and bit lines are matured while the word line is selected. Discharge of a self timed bit line will generate a RESET signal, which is used to reset the internal clock, and consequently enable a sense amplifier, disable the word line, and activate bit line pre-charge. The enabled bit line sense amplifier senses from the matured bit line a differential voltage and passes the read data to a data latch and output buffer.

It is important to obtain a proper sense margin (i.e., differential voltage). If the sense margin is too small, i.e., the bit line maturing time is too short because the self timed interval is not long enough, the sense amplifier may not be able to accurately ascertain a data value stored in an accessed memory cell. Thus, the bit lines must mature for a long enough period to achieve a minimum bit line voltage differential. On the other hand, if the maturing time is longer than necessary, power is wasted, as the bit lines continue charging even after the desired bit line voltage differential has been obtained.

The sense timing should be optimized to obtain a proper setup time. If the sensing is delayed too much, the setup time will be delayed. So for fast memory, it is preferred to start the sense enable time as early in the cycle as possible. As noted above, however, a problem with sensing early is that the sense margin will be smaller, potentially causing problems in process variations.

The situation is further complicated in compiler memory, as different size memories will have different optimal bit line maturing times. For small size memory, the signal propagation delay is very short. Accordingly, as soon as the word line rises the bit line will mature quickly and sensing can start earlier. For large memory the bit line capacitance will be larger, and the bit line will mature more slowly. Thus, sensing must wait until after a longer propagation delay.

Because of the different optimal sense times in different size memories, it is important to track the bit line and word line properly. Moreover, as technology scales down and devices become smaller, there are significant process variations in memory bit cells. Tracking memory internal timing to guarantee both high performance and high yield becomes a challenge.

Often, a simulation, such as a Monte Carlo simulation, is performed to determine how much sense margin occurs in a specific process. Based upon the simulation results, a sense enable time can be estimated for various memory sizes. Simulations, however, have drawbacks in that they do not account for real world conditions. Thus, it is preferable to actually track delay to determine sense margins.

A conventional bit line tracking scheme is illustrated in FIGS. 1 and 2. FIG. 1 is a block diagram of a prior art memory, including a memory array 110, a control block 120, a pre-decoder 130, a row decoder and word line driver 140, and a dummy word line driver 150. Also provided are sense amplifiers 160 and a data output buffer 170. The memory array 110 includes a dummy word line DWL, and a dummy column having a dummy bit line DBL and dummy bit line bar DBLB, as well as a dummy bit cell 112. Word lines WL[n]-WL[0] are provided. The memory array 110 also includes numerous bit cells 114, bit lines BL and bit line bars BLB, only one of each being depicted. Programmable dummy pull down devices 116 are also provided. The programmable dummy pull down devices 116 have the same characteristics as the real bit cells 114.

The word lines WL[n]-WL[0] receive an internal clock signal ICLK from the control block, after a six gate delay. The six gate delay results from the internal clock signal ICLK passing through the pre-decoder 130 (two gate delay) and the row decoder and word line driver 140 (four gate delay). In order to track the word lines WL[n]-WL[0], the dummy word line driver 150 is also provided with a four gate delay. This delay is to ensure the dummy word line DWL receives the internal clock signal ICLK at the same time as the word lines WL[n]-WL[0].

FIG. 2 shows a timing diagram for a prior art bit line tracking scheme. An internal clock signal is represented by ICLK. WL represents a word line signal. A bit line and dummy bit line are represented by BL and DBL, respectively. A dummy word line signal is represented by DWL. Sense enable corresponds to a sense enable signal.

For a dummy bit line to track a bit line maturing time $t_{b1}$ needed to achieve a desired bit line voltage differential $\Delta V_{b1}$, dummy bit line and dummy word line are both asserted at a real word line rising time. Thus, the real word line and dummy word line go high at the same time t1, in response to the internal clock signal ICLK rising.

The dummy bit line DBL will mature faster than the real bit line BL, usually 3-5 times faster, because a delay g1 is necessary between the time when the dummy bit line DBL is determined to be mature and the start of sensing. Such delay g1 is necessary to drive the sense enable signal and also to allow enough time for decoding of the sense enable signal by a column multiplexer. A drawback of the faster maturing time of the dummy bit line DBL is that the dummy bit line DBL does not really approximate the real maturing time of the real bit line BL, reducing tracking accuracy. Moreover, the bit line maturing time $t_{b1}$ can not be tracked very well by the self timing loop across process-voltage-temperature (PVT) corners.

Based upon desired voltage differential of the dummy bit line $\Delta V_{db1}$, at time $t_{db1}$ plus the gate delay g1 after time t1 a sense enable signal is asserted. Such timing should coincide with the bit line maturing time $t_{b1}$. However, the gate delay g1 must be appropriately set to ensure the sense enable time is not too early, i.e., before the bit line BL is mature. The setting of the gate delay g1 timing is difficult, especially when the dummy bit line DBL does not mature at the same rate as the real bit line BL. Thus, extra time is usually inserted in the gate delay g1, to ensure the bit line BL has actually matured. Of course, the extra delay means the sense enable time is not immediately after the bit line BL has matured, but rather is a safe period afterwards.

Another problem is that the word line gating time is controlled by the sense enable time. After the sense enable signal goes to low, the word line WL is gated. The sense enable timing is delayed a default time (gate delay g1) after $t_{db1}$. From the sense enable time there are additional gate delays to de-assertion of the word line WL, resulting in the bit line BL continuing to charge. In other words, even after the actual bit line sensing, the word line remains asserted. Consequently, power is wasted.

SUMMARY

Memory operational efficiency can be achieved by use of a dummy bit line to control the read/write operation of the memory. In one embodiment, a dummy bit line known to have maturing times predictable with respect to the real bit line is started a known period of time ahead of the real bit line. The read/write operation is triggered based upon a maturing of the dummy bit line.

The dummy bit line begins maturing prior to when a real bit line starts maturing. As a result, the dummy bit line can accurately track the real bit line by maturing at a rate the same (or similar) as the rate the real bit line matures. The dummy bit line can finish maturing early enough to start a gate delay required before a sense enable time while still permitting the sensing to begin right after the bit line is mature. In addition, the word line can be gated by the dummy bit line, saving power.

A method controls a compiler memory read operation. The method includes generating a desired pulse width based upon a dummy bit line maturing at a rate similar to a real bit line maturing rate. The method also includes controlling a real word line with the desired pulse width to enable the read operation of the compiler memory.

Another method determines a sense enable time for compiler memory. The method includes enabling a dummy word line prior to enabling a real word line, and maturing a dummy bit line in response to enabling of the dummy word line. The dummy bit line matures at a same rate that a real bit line matures. The method also includes disabling the dummy word line in response to determining a threshold voltage differential has been achieved by monitoring the dummy bit line, and enabling a word line a predefined delay after enabling the dummy word line. The method further includes generating a sense enable signal in response to disabling the dummy word line.

A further method performs a memory read operation. The method includes starting a dummy bit line a known period of time prior to a start of a real bit line. The dummy bit line has a maturing time predictable with respect to the real bit line. The method also includes triggering a disabling of a word line based upon a maturing of the dummy bit line.

A compiler memory circuit includes a control circuit that generates an internal clock signal, and a dummy word line that directly receives the internal clock signal. The compiler memory circuit also includes an address decoding circuit that directly receives the internal clock signal, and a word line that receives the internal clock signal from the address decoding circuit a time period after the dummy word line received the internal clock signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DESCRIPTION OF EMBODIMENTS OF THE INVENTION

Figure 3:
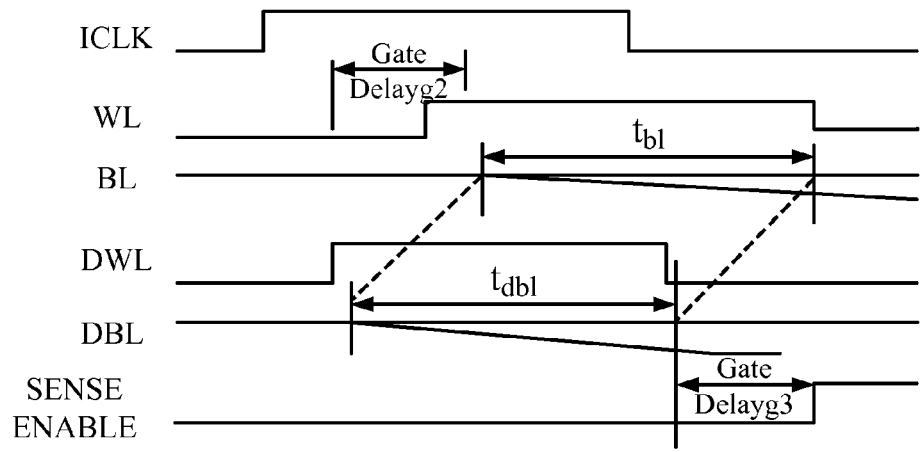
FIG. 3 is a timing diagram showing improved bit line tracking timing, according to an aspect of the present disclosure.

This disclosure presents an advanced bit line tracking scheme in compiler memory design. In one embodiment, the memory is static random access memory (SRAM). As shown in FIG. 3, by enabling a dummy word line DWL earlier than a real word line WL, logic gate delay g2+ bit line maturing time $t_{b1}$=dummy bit line discharge time $t_{db1}$+ logic gate delay g3.

The logic delay can be cancelled out in the timing tracking loop if g2 and g3 have the same gate count and fan-out loadings. The dummy pull down devices 116 (FIG. 5) are designed to have the same characteristics as the bit cells 114 (FIG. 5), therefore, the real bit line BL timing can be fully tracked by the dummy bit line DBL for all PVT corners. The word line enable path and sense enable path are designed to ensure the paths have the same gate count and same logic gate type and fan-out loadings.

The self timing loop includes a dummy bit line DBL and a dummy word line DWL having the same structure and size as a regular array column and row. Therefore, all the global wire loadings (word line and bit line) are included in the bit line BL tracking loop.

In addition, to guarantee the optimal read margins for all PVT corners and all memory configurations, the dummy pull down devices 116 are designed to be adjustably programmed by metal masking.

Figure 4:
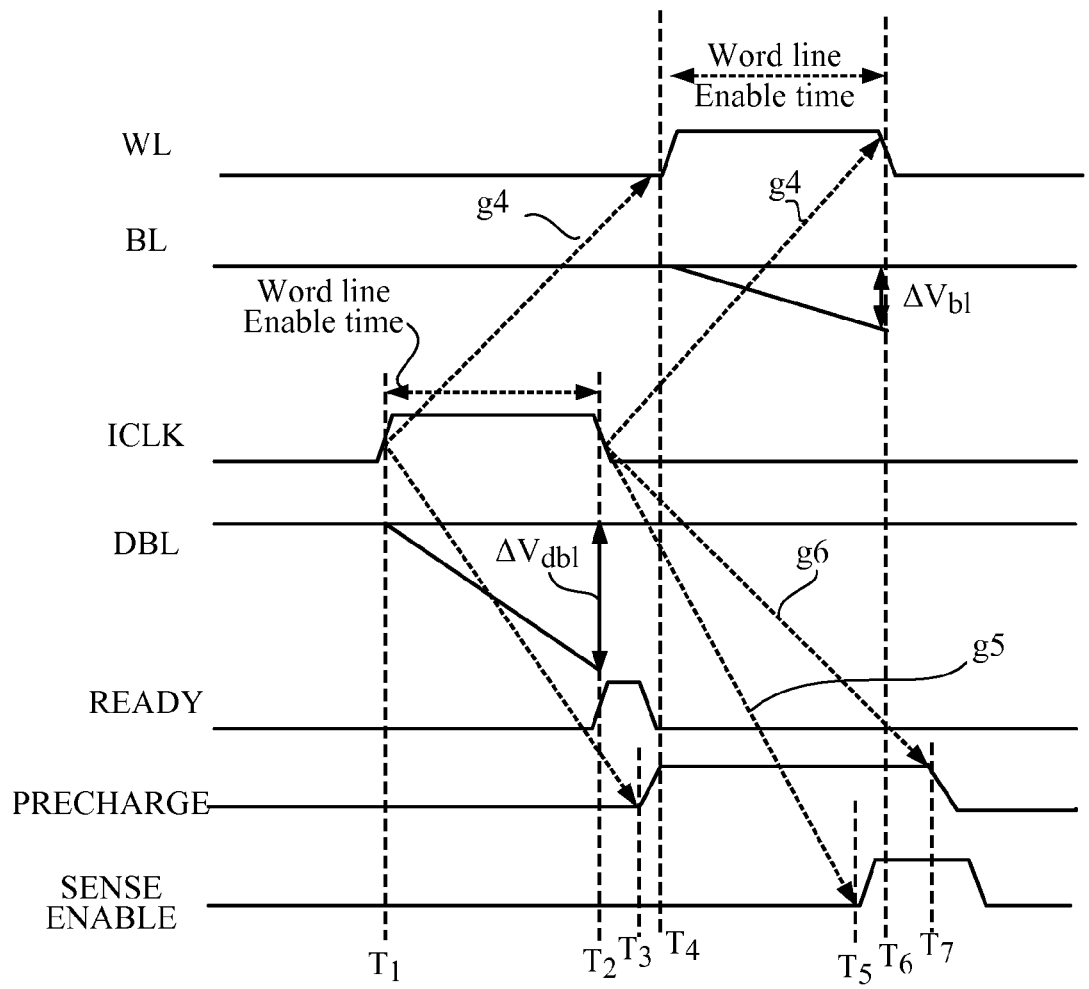
FIG. 4 is a more detailed timing diagram showing improved bit line tracking timing, according to an aspect of the present disclosure.

Referring to FIG. 4, determination of a sense enable time is now discussed. To obtain the sense enable time, the present disclosure controls internal clock (ICLK) or dummy word line DWL rising and falling times. In FIG. 4, the dummy word line signal is shown as ICLK, as the dummy word line is merely a buffered version of the internal clock signal ICLK and thus does not require separate depiction. The internal clock signal (or dummy word line DWL signal) ICLK rise time turns on the dummy bit line DBL at time t1. In other words, the ICLK signal is direct to the dummy word line DWL. The dummy word line DWL mimics the real word line WL, i.e., it monitors the word line WL propagation delay. Moreover, because the dummy bit line DBL began maturing before the real bit line BL begins maturing, the dummy bit line DBL can fully track the real bit line BL, i.e., the dummy bit line DBL matures at the same (or similar) rate as the real bit line BL. After this dummy bit line DBL turns on and matures, based upon the proper $\Delta V_{db1}$, a ready signal is generated at time t2. In response to the ready signal, the internal clock signal ICLK is disabled. Thus, an internal clock signal ICLK pulse width is created based upon maturing of the dummy bit line DBL, which fully tracks a real bit line BL maturing time.

The internal clock ICLK pulse width is then used to create a real word line signal WL pulse width. Description of generating the real word line signal WL pulse width is now provided.

The real word line WL is driven at time t4, which is after the dummy word line DWL has been driven. More specifically, after the pre-decoder driver delay and row decoder and word line driver delay (collectively gate delay g4), the real word line WL will be driven (at time t4). In other words, after time t1 and gate delay g4, the word line WL is driven (at time t4).

Precharge disable (precharge signal rising) occurs at time t3, which is slightly before time t4. In one embodiment, time t3 is one or three gates delays before time t4. At time t5 a sense enable signal is generated by delayed logic from ICLK falling edge. The delayed logic 175 (FIG. 5) has a similar delay as the pre-decoder 130, and row decoder and word line driver 140. The delay period g5 before sense enable is about one gate delay shorter than the delay g4 to ensure the sensing occurs when the bit line BL is ready before the word line WL turns off.

At time t6, the word line WL is disabled a certain gate delay g4 after the internal clock signal ICLK was disabled at time t2. The certain gate delay g4 is the same delay as the gate delay g4 before the word line WL is enabled. Thus, the word line WL tracks in parallel with the internal clock signal ICLK. Precharge enable occurs at time t7 which is later than word line WL disable.

Figure 1:
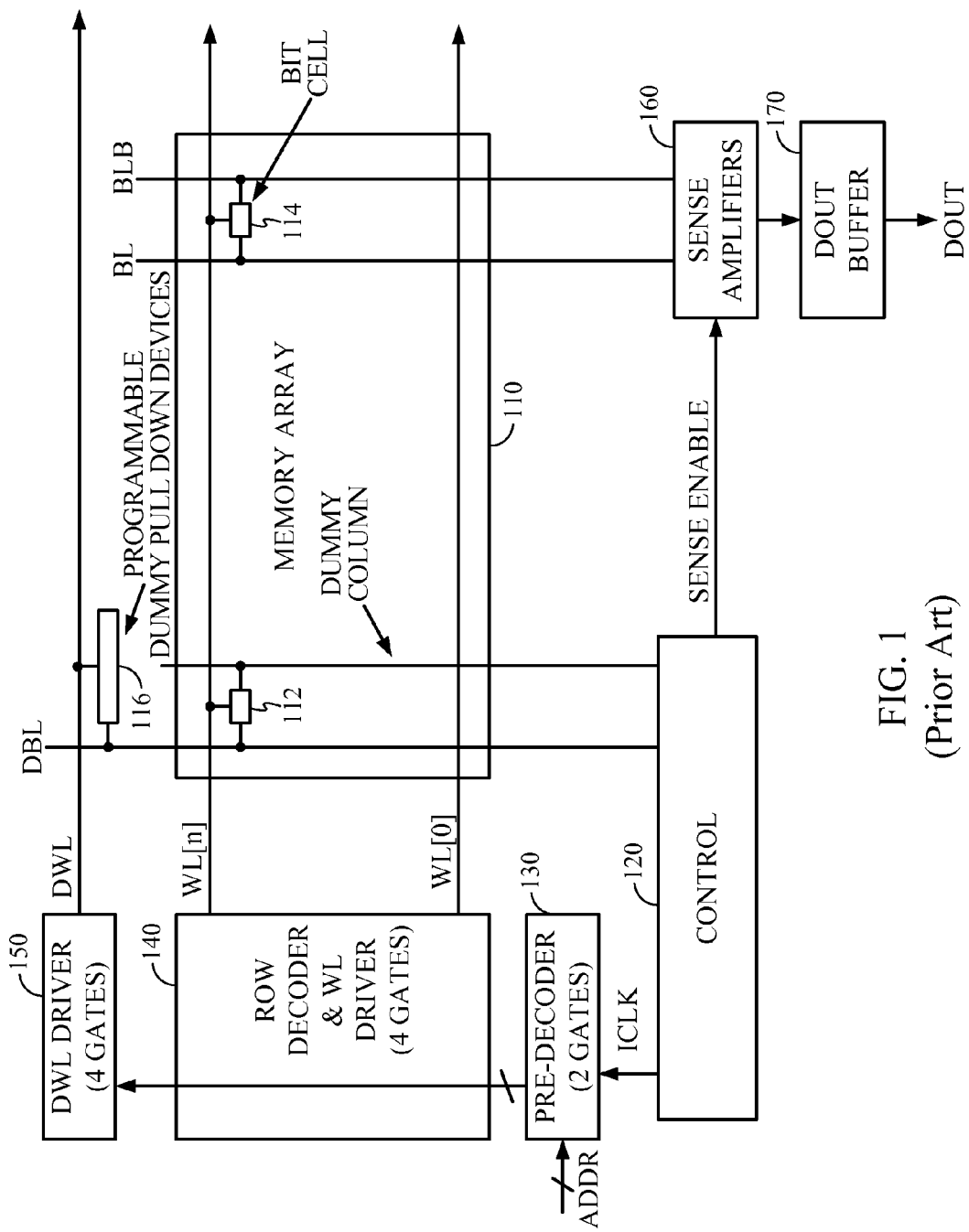
FIG. 1 is a block diagram showing a prior art bit line tracking system.
Figure 2:
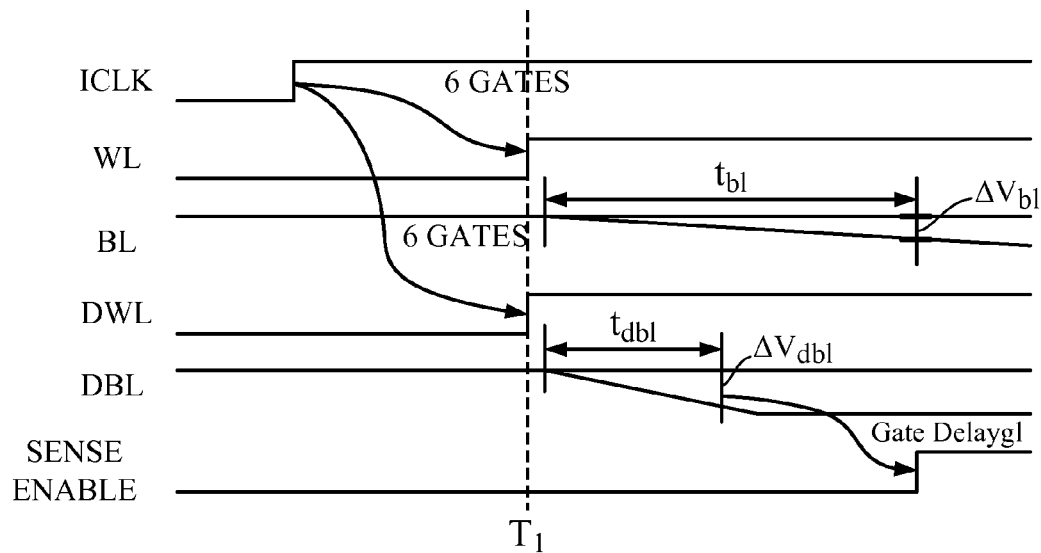
FIG. 2 is a timing diagram showing prior art bit line tracking timing.
Figure 5:
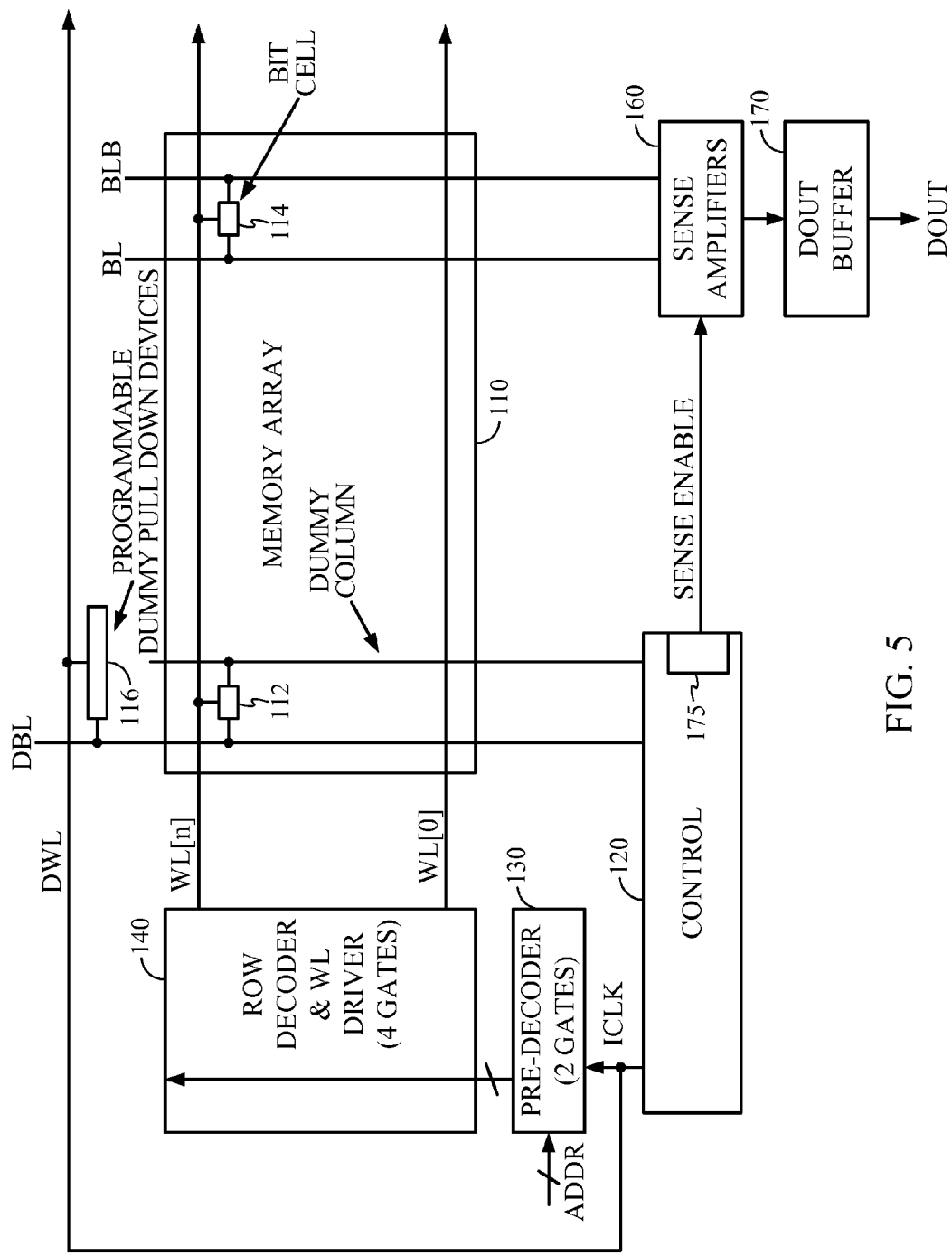
FIG. 5 is a block diagram showing an improved bit line tracking system, according to an aspect of the present disclosure.

According to the present disclosure, instead of a dummy word line DWL being driven by a dummy word line driver 150 (FIG. 1), the internal clock signal ICLK directly drives the dummy bit line DBL, as seen in FIG. 5. The internal clock signal ICLK is provided to the dummy word line DWL directly, resulting in the dummy bit line DBL being tracked earlier than the actual bit line BL.

Because monitoring of the maturing dummy bit line DBL begins early, at time t1, even with small size memory the bit line BL can be monitored quickly. Monitoring can begin without waiting until after the gate delay. As a result of the early dummy bit line DBL monitoring, the dummy bit line DBL can fully track the real bit line BL, and be finished maturing early enough to trigger the sense enable so that the sense amplifiers are enabled right after the bit line BL is matured.

The teachings of the present disclosure offer better performance than previous technology. For example, the word line WL gating time is not controlled by the sense enable time. Rather, as seen in FIG. 4, the internal clock signal ICLK controls the word line WL with a parallel delay between assertion of each signal and parallel delay between de-assertion of each signal. Thus, the real word line WL will be gated at time t6, just after the sense enable signal rises. Because the word line WL does not remain asserted during a delay after the sensing operation starts, power is saved.

In other words, as a result of the known delay between when the dummy bit line DBL and bit line BL begin maturing, it can be determined when the bit line BL will be optimally mature: the same known delay after the dummy bit line DBL is mature. Thus, the bit line BL can be disabled right after the optimum bit line maturing time, thereby saving power In one embodiment, the dummy bit lines DBL are the same as real bit lines BL for each different size memory. The dummy bit line discharging can be programmable by an accelerator programmable circuit (not shown), which can be provided in the control block 120. The accelerator programming circuit can be programmed to set the dummy bit line DBL maturing time, as described in U.S. patent application Ser. No. 11/614,828, filed Dec. 21, 2006, in the names of Z. CHEN et al., the disclosure of which is expressly incorporated by reference herein in its entirety.

In FIG. 5, the dummy word line DWL, dummy bit line DBL, dummy bit cell 112 and dummy pull down devices 116 are shown outside of the control block 120, primarily in the memory array 110. In an alternative embodiment, the dummy word line DWL, dummy bit line DBL, dummy bit cell 112 and dummy pull down devices 116 can be provided in a data path area, such as in the vicinity of sense amplifiers 160 and/or data output buffer 170. In another embodiment, the dummy word line DWL, dummy bit line DBL, dummy bit cell 112 and dummy pull down devices 116 are provided in the control block 120.

According to the present disclosure, a bit line tracking scheme is described that is PVT and configuration tolerant, high performance, and low power. The bit line tracking is high performance because the sense amplifiers are enabled right after the optimum bit line maturing. The bit line tracking scheme is low power because the word line is disabled after the optimum bit line maturing to save active power.

In summary, the present disclosure provides advanced bit line tracking for high performance and low power memory compiler design. By enabling the dummy word line earlier than the real word line, a logic gate delay is cancelled out from the tracked timing loop. Real bit cell timing can be fully tracked by dummy pull down devices having the same characteristics. Sense amplifiers are enabled and the word line is disabled right after the optimum bit line maturing time. The programmable dummy pull down devices tolerate PVT and memory configuration variations.

Figure 6:
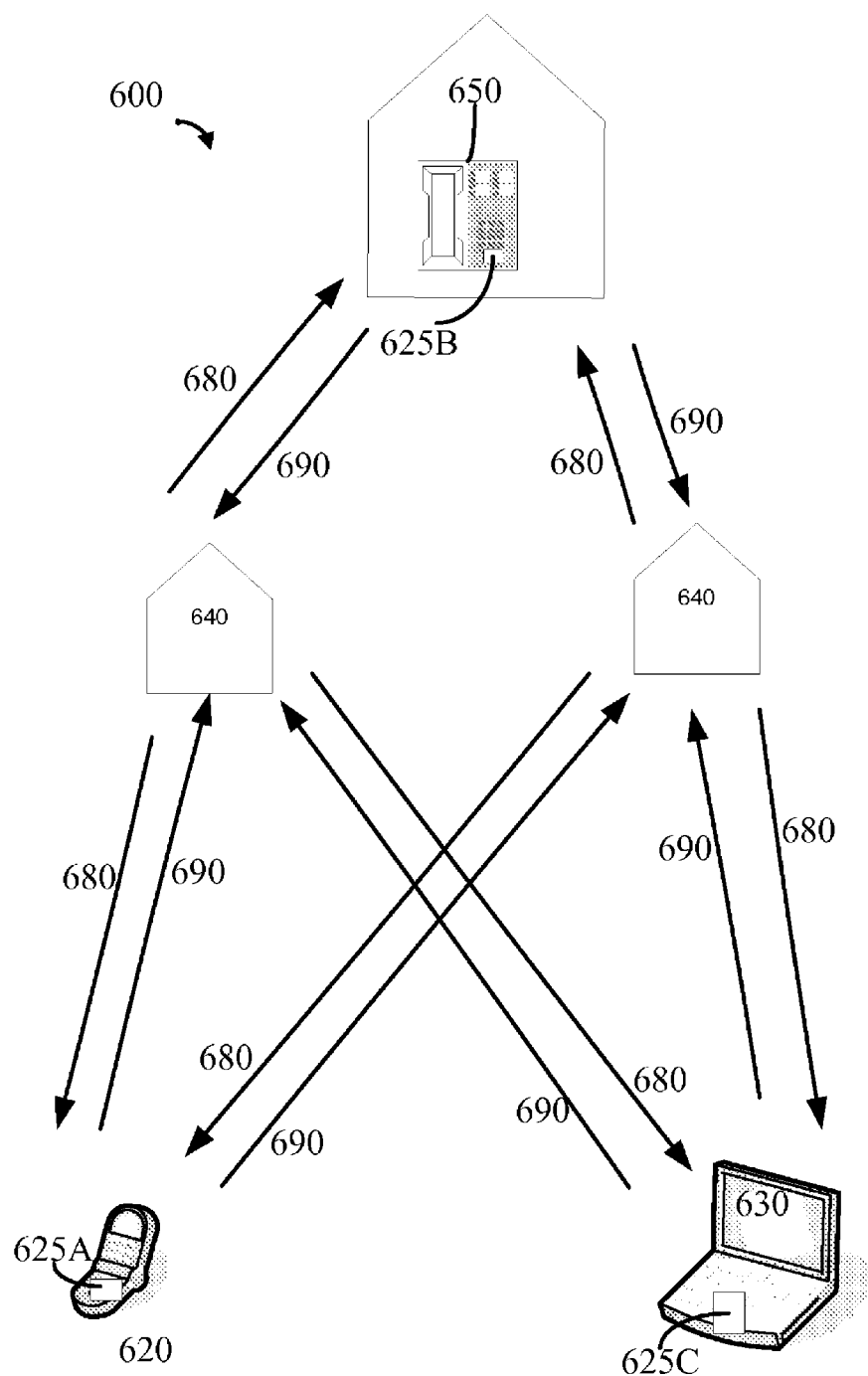
FIG. 6 is a block diagram showing an exemplary wireless communication system in which an embodiment of the invention may be advantageously employed.

FIG. 6 shows an exemplary wireless communication system 600 in which an embodiment of the invention may be advantageously employed. For purposes of illustration, FIG. 6 shows three remote units 620, 630, and 650 and two base stations 640. It will be recognized that typical wireless communication systems may have many more remote units and base stations. Remote units 620, 630, and 650 include improved full-swing memory arrays 625A, 625B, and 625C, respectively, which are embodiments of the invention as discussed further below. FIG. 6 shows forward link signals 680 from the base stations 640 and the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 6 illustrates remote units according to the teachings of the invention, the invention is not limited to these exemplary illustrated units. The invention may be suitably employed in any device which includes a full-swing memory array.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although the present invention and its advantages have been described in detail, it should be understood that various changes, substitutions and alterations can be made herein without departing from the spirit and scope of the invention as defined by the appended claims. For example, although a read operation has been used in the discussion, it is envisioned that the invention equally applies to write operations. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for controlling a compiler memory read operation, comprising:
    generating a pulse having a desired pulse width based upon a dummy bit line maturing at a rate similar to a real bit line maturing rate;
    controlling a real word line with the desired pulse width to enable the read operation of the compiler memory, the real word line disabling a first delay period after a falling edge of the pulse; and
    controlling a sense amplifier based on a second delay period and the falling edge of the pulse, the first delay period being shorter than the second delay period,
    wherein generating the desired pulse width comprises asserting a dummy word line prior to asserting a real word line, and disabling the dummy word line when the dummy bit line is mature, such that a sense margin reaches a threshold value.

2. The method of claim 1, in which the dummy bit line begins maturing directly in response to generation of an internal clock signal.

3. A method for determining a sense enable time for compiler memory, comprising:
    enabling a dummy word line prior to enabling a real word line;
    maturing a dummy bit line in response to enabling of the dummy word line, the dummy bit line maturing at a rate similar to a rate a real bit line matures;
    disabling the dummy word line in response to determining a threshold voltage differential has been achieved by monitoring the dummy bit line;
    enabling the real word line a predefined delay after enabling the dummy word line;
    disabling the word line the predefined delay after disabling the dummy word line; and
    generating a sense enable signal in response to disabling the dummy word line a second delay after disabling the dummy word line, the second delay being less than the predefined delay.

4. The method of claim 3, in which the predefined delay is based upon a pre-decoder gate delay.

5. The method of claim 4, in which the predefined delay is based upon a row decoder and word line driver gate delay.

6. The method of claim 5, in which the enabling the word line occurs after receiving the internal clock signal from a pre-decoder, a row decoder, and a word line driver.

7. A compiler memory circuit, comprising:
    a control circuit that generates an internal clock signal;
    a dummy word line that directly receives the internal clock signal;
    an address decoding circuit that directly receives the internal clock signal; and
    a word line that receives the internal clock signal from the address decoding circuit, a time period after the dummy word line received the internal clock signal and after the dummy word line deasserted.

8. The circuit of claim 7, in which the address decoding circuit comprises a pre-decoder, a row decoder and a word line driver.

9. The circuit of claim 7, further comprising a memory array having a plurality of bit cells and a plurality of bit lines.

10. The circuit of claim 9, further comprising a plurality of sense amplifiers.

11. The circuit of claim 9, further comprising at least one programmable dummy pull down device.

12. The circuit of claim 9, in which the dummy word line is provided within the memory array.

13. The circuit of claim 7, in which the dummy word line is provided within the control circuit.

14. The circuit of claim 7, further comprising a dummy gate system having a same number of gates, a same type of gates, and a same fan-out loading as the address decoding circuit, the dummy gate system being in a sense enable path, the dummy gate system ensuring that the sense enable signal is delayed a shorter period of time than the internal clock signal is delayed prior to being received at the word line.

15. A method for performing a memory read operation, said method comprising:
    starting a dummy bit line a known period of time prior to a start of a real bit line, said dummy bit line having a maturing time predictable with respect to said real bit line;
    enabling a precharge a first delay period after starting the dummy bit line, the first delay period being shorter than the known period of time;
    disabling the precharge a third delay period after maturing of said dummy bit line, the third delay period exceeding the known period of time; and
    triggering a disabling of a word line the known time period after a maturing of said dummy bit line.

* * * * *

UNITED STATES PATENT AND TRADEMARK OFFICE
CERTIFICATE OF CORRECTION

| | | |
|---|---|---|
| PATENT NO. | : 7,859,920 B2 | Page 1 of 1 |
| APPLICATION NO. | : 12/048676 | |
| DATED | : December 28, 2010 | |
| INVENTOR(S) | : Jung et al. | |

It is certified that error appears in the above-identified patent and that said Letters Patent is hereby corrected as shown below:

Column 8, line 17, claim 6: "the internal" to read as --an internal--

Signed and Sealed this
Thirtieth Day of August, 2011

David J. Kappos
*Director of the United States Patent and Trademark Office*